(12) United States Patent
Takagiwa et al.

(10) Patent No.: US 6,501,702 B2
(45) Date of Patent: Dec. 31, 2002

(54) SEMICONDUCTOR MEMORY INTEGRATED CIRCUIT

(75) Inventors: Teruo Takagiwa, Kawasaki (JP); Masami Masuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/866,065

(22) Filed: May 25, 2001

(65) Prior Publication Data

US 2001/0048632 A1 Dec. 6, 2001

(30) Foreign Application Priority Data

May 30, 2000 (JP) ........................................ 2000-159480

(51) Int. Cl.[7] ................................................. G11C 3/00
(52) U.S. Cl. ................................................. 365/230.06
(58) Field of Search ....................... 365/230.06, 230.08, 365/233, 233.5

(56) References Cited

U.S. PATENT DOCUMENTS 5,963,503 A * 10/1999 Lee ........................ 365/230.06
6,343,037 B1 * 1/2002 Park et al. ............. 365/230.06

FOREIGN PATENT DOCUMENTS

| JP | 2000-030463 | 1/2000 |
| JP | 2000-049309 | 2/2000 |
| JP | 2000-132968 | 5/2000 |

* cited by examiner

*Primary Examiner*—Tan T. Nguyen
(74) *Attorney, Agent, or Firm*—Hogan & Hartson, LLP

(57) ABSTRACT

An address buffer includes a latch circuit, and is controlled by an internal clock signal sent from a clock buffer. A decoding circuit section for selecting a word line is formed of a predecoder and a row decoder for further decoding a decoded output from the predecoder. The predecoder has no latching function, and the row decoder has a latch circuit. A pulse generating circuit generates two timing pulses based on a clock signal CK1. The activation of the row decoder is controlled by the two timing pulses.

18 Claims, 15 Drawing Sheets

SEMICONDUCTOR MEMORY INTEGRATED CIRCUIT

Cross Reference to Related Application

This application claims benefit of priority under 35USC§ 119 to Japanese Patent Application No. 2000-159480, filed on May 30, 2000, the entire contents of which are incorporated by reference herein.

BACKGROUND OF THE INVENTION

1. Field of the Invention

The present invention generally relates to clock synchronization type semiconductor memory integrated circuits and, more particularly, to an improvement of an address decoding circuit.

2. Related Background Art

FIG. 14 shows a block diagram of a prior art clock synchronization type semiconductor memory integrated circuit. An external clock signal CLK is inputted to a clock buffer 4, in which internal clock signals CK1 and CK2 are generated. Address signals are inputted to an address buffer 8 in sync with the clock signals CK1, among which a row address signal is sequentially decoded by a predecoder 6 and a row decoder 7 to select a word line WL of a memory cell array 1.

The internal clock signal CK2 from the clock buffer 4 and a timing pulse PULSE generated at a pulse generating circuit 5 based on the internal clock signal CK1 are sent to the predecoder 6. The timing pulse PULSE is used for adjusting a transfer timing of a predecoded output PD1 to the row decoder 7.

A column address is decoded by a column decoder 9. Based on the decoded output from the column decoder 9, a column gate 3 is selectively driven to select a bit line of the memory cell array 1. Data of a memory cell MC determined by the selected word line WL and the selected bit line BL is read out to the bit line BL, sensed and amplified by a sense amplifier 2, and outputted via a data buffer 10.

In a large-scale semiconductor memory circuit, the memory cell array 1 is divided into a plurality of memory sections 1-1 to 1-n, as shown in FIG. 15. A main word line MWL is shared by the memory sections 1-1 to 1-n, and a plurality of word lines WL, each corresponding to one of the memory sections, are selectively connected to the main word line MWL in accordance with section selection signals SSL1 to SSLn.

FIG. 16 shows an example of a specific configuration of the row address decoding system (word line selecting system) shown in FIG. 14. The address buffer 8 includes a latch circuit (master latch), having inverters INV 4 and INV 5, for temporally holding address data inputted in sync with the clock signal CK1. In order to carry out a grouping selection of a plurality of main word lines MWL, the predecoder 6 includes a predecoding section 6a for selecting one line from a bundle of main word lines MWL, and a predecoding section 6b for selecting a bundle of main word lines MWL.

The predecoding sections 6a and 6b have NAND gates NAND1 and NAND3, respectively, for decoding an internal address A0 sent from the address buffer 8 in accordance with the clock signal CK2. Further, the predecoding sections 6a and 6b have latch circuits (slave latches) formed of inverters (INV9, INV10) and (INV13, INV14), respectively. The decoded output latched by the predecoding section 6a is taken from a NAND gate NAND 2 and sent to the row decoder 7 as an output PD1. The latch data of the other predecoding section 6b is sent to the row decoder 7 as an output PD2 via inverters INV15 and INV16 without being adjusted by the timing pulse.

The pulse generating circuit 5 generates a timing pulse PULSE in consideration of the number of logical circuits (delays) provided before the predecoder 6 decodes an address externally received. Specifically, in the example shown in FIG. 16, odd-number inverters INV24 to INV26 and a NAND gate NAND5 form an edge detecting circuit 51 for detecting a rising edge of the internal clock signal CK1, and even-number inverters INV28 to INV31 and a NOR gate NOR1 form a pulse width setting circuit 52 for determining a pulse width. Therefore, the pulse generating circuit 5 generates, in sync with a rising of the clock signal CK1, a timing pulse PULSE having a pulse width determined by the delays of the inverters INV28 to INV31.

The row decoder 7 includes a NAND gate NAND4 for further decoding the predecoded output PD2 and transfer gate transistors M1 and M2, which are controlled by the output of the NAND 4 and transfer the predecoded output PD1 to the main word line MWL. In more detail, in the row decoder, when the prededecoded output PD2 is inputted (all 1's), the output of the NAND gate NAND4 becomes "L", thereby turning on the transfer gate transistors M1 and M2 to supply the predecoded output PD1 to the main word line MWL.

FIG. 17 shows the timings in the above described row address decoder from the input of the external clock signal CLK to the activating of a word line. A timing pulse PULSE is generated so as to have a predetermined pulse width in which the predecoded outputs PD1 and PD2 are accomplished. Thus, the predecoded outputs PD1 and PD2 are further decoded by the row decoder 7, and the selection of a main word line MWL and a selection of a word line ML are carried out. In addition, in the row decoder 7, three inverters INV18 to INV20 inserted after the transfer gate transistors M1 and M2 are for the purpose of waveform formation, because an "H" level attenuation occurs in the transfer gate transistors M1 and M2, and the signal level is not fully compensated by only a single inverter. After a main word line MWL is selected, a word line WL is selected by a NOR gate NOR2 activated by a section selection signal SSL.

In the prior art clock synchronization type address decoder shown in FIG. 16, it is preferable to reduce the delay determined by the number of the logical circuits in the address buffer 8 and the predecoder 6, and to speed up the rising of a timing pulse PULSE generated by the pulse generating circuit 5 as much as possible. Since these sections are already formed of a minimum number of logical circuits, it is difficult to remarkably speed up the operations of these sections unless it is possible to reduce the delay of each logical circuit.

In the circuit arrangement shown in FIG. 16, it is rather the number of logical circuits needed to be used after the generation of the timing pulse PULSE until the selection of a word line WL that is preventing the speeding up of the operations. In FIG. 16, if the transfer gate transistors (M1, M2) are assumed to be a single logical circuit, the number of the logical circuits after the generation of the timing pulse PULSE until the selection of a word line WL is seven (NAND2, INV11, (M1, M2), INV18 to INV20, and NOR2). Due to the existence of these logical circuits, a considerable delay is caused before a word line is activated. In FIG. 17, a delay after the rising of the timing pulse PULSE until the activation of the selected word line WL is shown as τ2.

Further, as the capacities of semiconductor memories increase, if the number of bits in a row system is doubled, the number of row decoder is also doubled, thereby doubling the load per one predecoder. Accordingly, the delays caused by the predecoded outputs PD1 and PD2 are increased. In order to reduce such delays, the size of output buffer in the predecoder, i.e., the size of the inverters INV11 and INV16 in FIG. 16, maybe increased. However, there is a limit to the improvement of input waveform of a row decoder, which causes a large load. Further, there may arise another problem in that the increasing of the size of output buffer may increase power consumption.

SUMMARY OF THE INVENTION

Given the above mentioned circumstances, an object of the present invention is to provide a semiconductor memory integrated circuit in which the number of logical circuits needed to be used during a period from the input of a clock signal to the activation of a word line is reduced to speed up operations.

A semiconductor memory integrated circuit according to the present invention comprises: a memory cell array; a clock buffer for receiving a clock signal to generate an internal clock signal; an address buffer for receiving an address signal in accordance with said internal clock signal generated by said clock buffer; an address decoding circuit including a first stage decoder for decoding an internal address signal outputted from said address buffer to select a word line of said memory cell array, and a second stage decoder for further decoding an output of said first decoder to drive a selected word line; and a pulse generating circuit for generating a timing pulse for controlling an activation timing of said second decoder of said address decoding circuit based on the internal clock signal outputted from said clock buffer.

According to the present invention, timings of the first stage decoder of the address decoding circuit are not controlled by the use of clock signals, but timings of the second stage decoder are controlled thereby. Because of this, it is possible to reduce the logical delay caused in a period from the input of a clock signal to the activation of a selected word line, as compared to the prior art systems, thereby speeding up the operations.

DESCRIPTION OF THE PREFERRED EMBODIMENTS

The preferred embodiments of the present invention will be described with reference to the accompanying drawings.
(First Embodiment)

Figure 1:
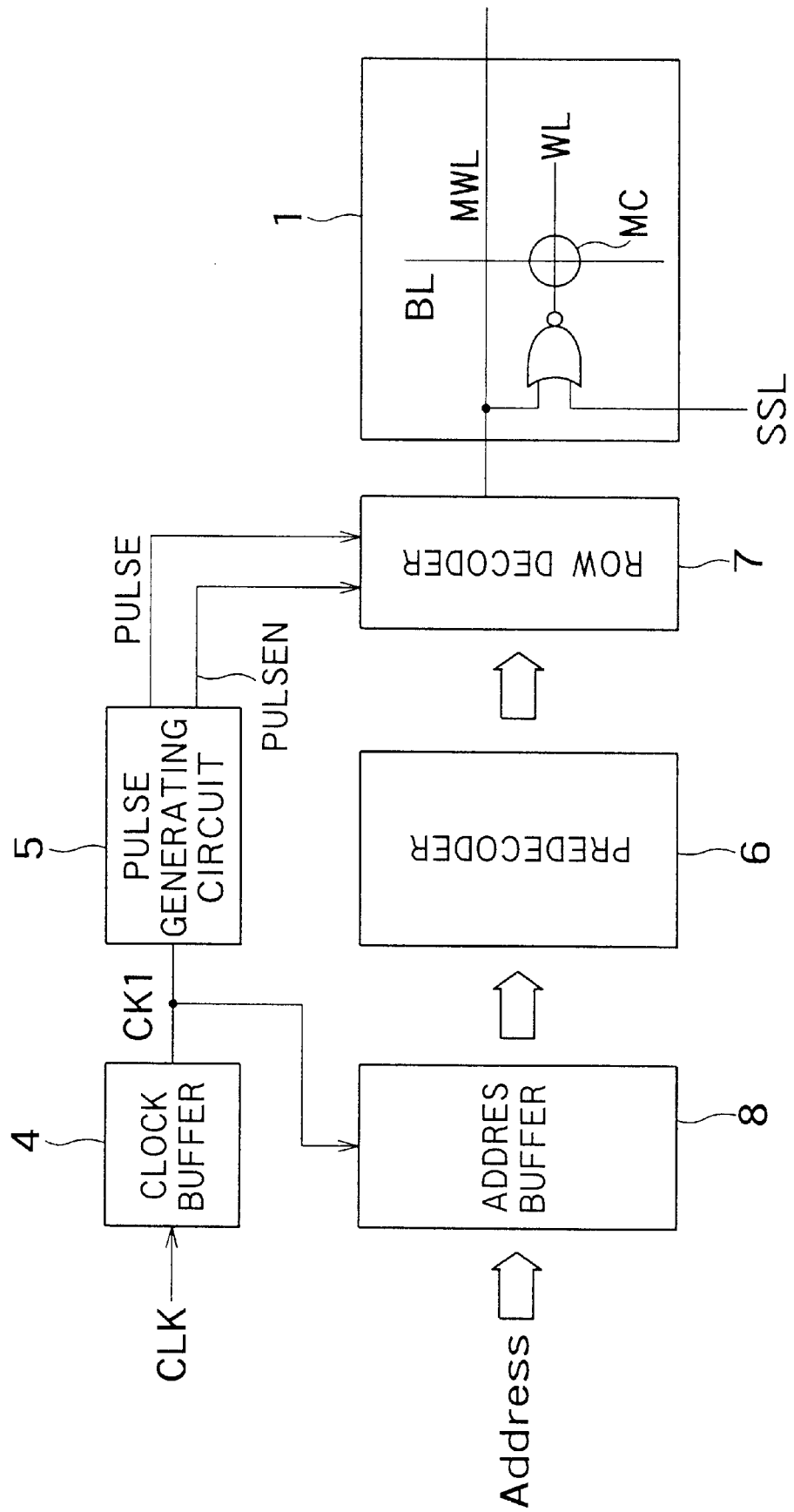
FIG. 1 is a block diagram showing a row address decoding system of a semiconductor memory circuit according to one embodiment of the present invention.
Figure 15:
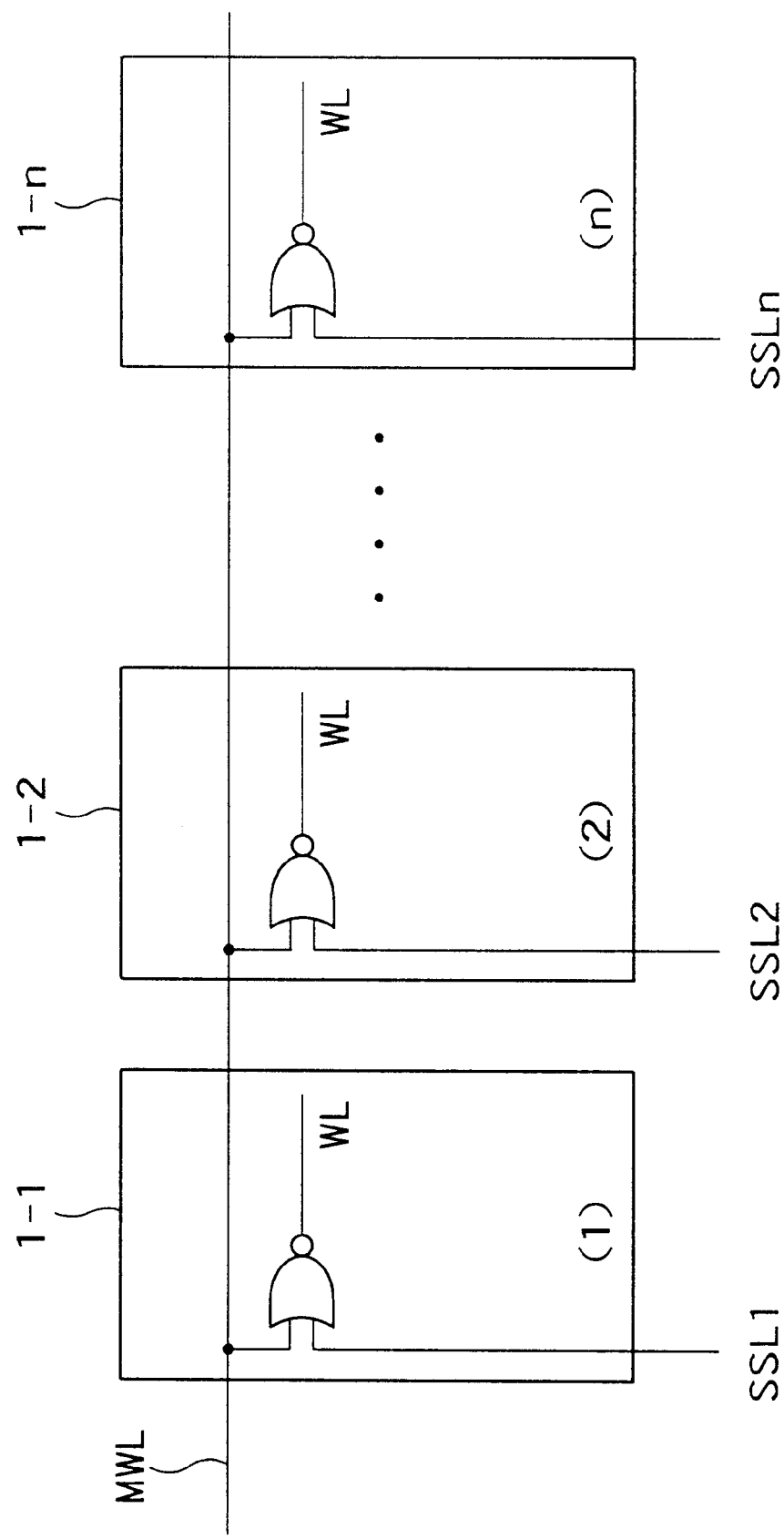
FIG. 15 is a drawing showing a configuration of a memory cell array of the semiconductor memory circuit shown in FIG. 14.

FIG. 1 is a block diagram of a row address decoding system of a semiconductor memory integrated circuit according to one embodiment of the present invention. The basic memory structure of this embodiment is the same as that of the prior art devices. A memory cell array 1 is formed by arranging static memory cells MC, and is divided into a plurality of sections as shown in FIG. 15. A predecoder 6 as a first stage decoder and a row decoder 7 as a second stage decoder, which further decodes the output of the predecoder 6, are provided for decoding a row address received by an address buffer 8 step by step, and selectively activating a word line WL.

An external clock signal CLK is received by a clock buffer 4, and the address buffer 8 is controlled in sync with an internal clock signal CK1. In this embodiment, a pulse generating circuit 5 generates two types of timing pulses PULSE and PULSEN based on the clock signal CK1. As will be described later, when the frequency of the external clock signal CLK is low, the timings and pulse widths of the timing pulses PULSE and PULSEN are identical, but when the frequency of the external clock signal CLK is high, the pulse width of one timing pulse PULSEN becomes narrower in accordance with the cycle of the external clock signal CLK.

The timing pulses PULSE and PULSEN generated by the pulse generating circuit 5 are sent to the row decoder 7. Unlike the prior art devices, no clock signal or timing pulse is sent to the predecoder 6. In this embodiment, both the address buffer 8 and the row decoder 7 have latch circuits, one operates as a master latch and the other operates as a slave latch, and the predecoder 6 does not have any latching function, and is designed to carry out only decoding operations.

Figure 2:
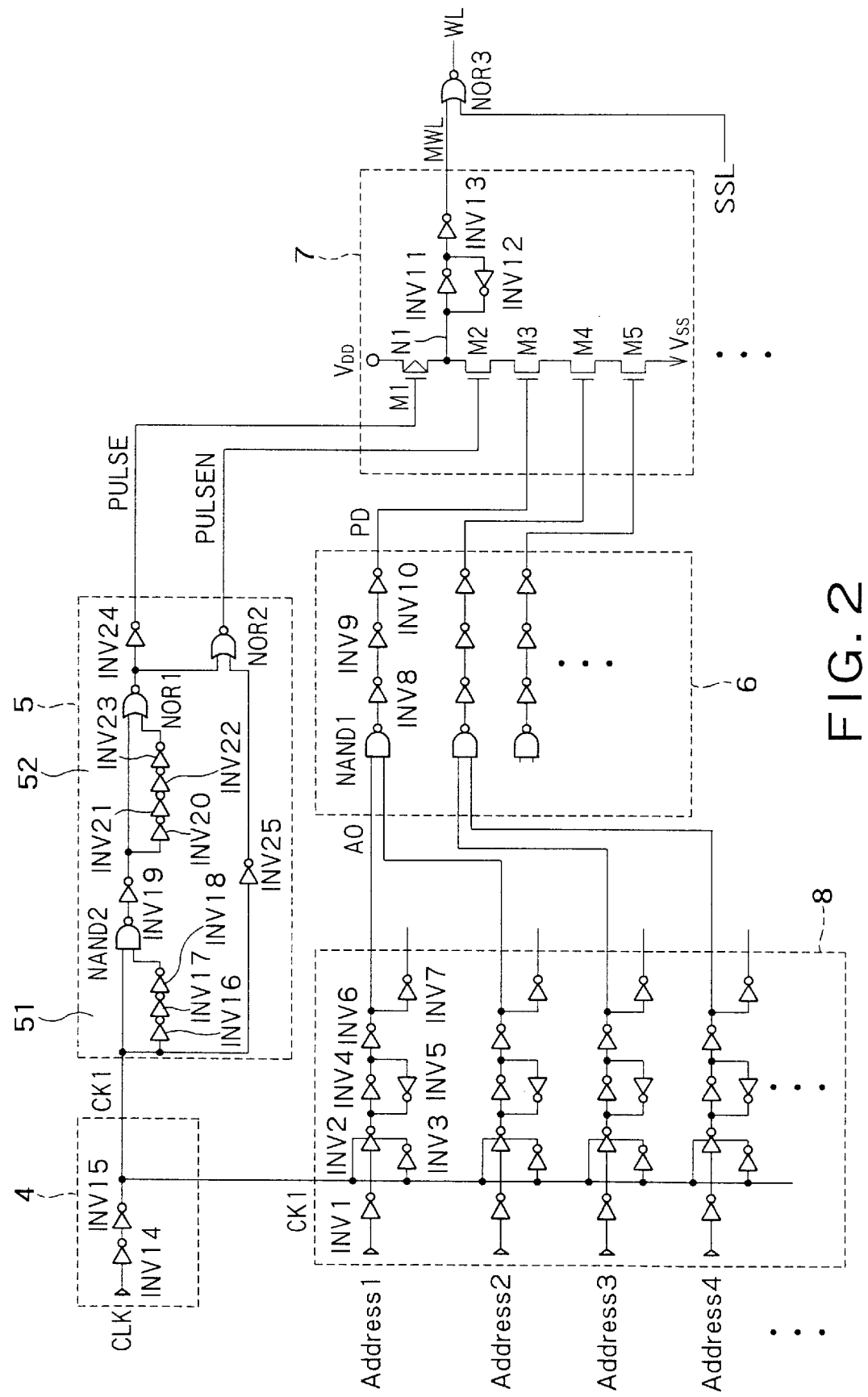
FIG. 2 is a drawing showing a specific configuration of the embodiment shown in FIG. 1.

FIG. 2 shows specific configurations of the sections shown in FIG. 1. The address buffer 8 receives an address signal at a clocked inverter INV2 activated by the clock signal CK1. The inputted address signal is held by a latch circuit (master latch) formed of inverse-parallel connected inverters INV4 and INV5. An internal address A0 outputted from the address buffer 8 is transferred to the predecoder 6. The predecoder 6 is formed of a NAND gate NAND1 serving as a decoding gate and three inverters INV8 to INV10 provided at the output stage, and as mentioned previously, the predecoder 6 includes no latch circuit.

A decoded output PD is inputted from the predecoder 6 to the row decoder 7, which is controlled by the timing pulses PULSE and PULSEN sent from the pulse generating circuit 5 to further decode the decoded output PD. The row decoder 7 includes a latch circuit (slave latch) formed of inverse-parallel connected inverters INV11 and INV12. A PMOS transistor M1 is connected between an input node N1 of the latch circuit and a power supply terminal VDD. The gate of the PMOS transistor M1 is driven by the timing pulse PULSE. A predetermined number of series-connected NMOS transistors M3 to M5 serving as decoding gates are provided between the input node N1 of the latch circuit and a grounding terminal VSS via an NMOS transistor M2 controlled by the timing pulse PULSEN. The latch circuit output of the row decoder 7 is connected to a main word line MWL of the memory cell array 1 via a single inverter INV13.

The pulse generating circuit 5 includes an edge detecting circuit 51 for detecting a rising edge of the clock signal CK1 and a pulse width setting circuit 52 for generating a timing pulse PULSE having a predetermined pulse width based on an output of the edge detecting circuit 51. The edge detecting circuit 51 is formed of an odd number of inverters INV16 to INV18 and a NAND gate NAND2. The pulse width generating circuit 52 is formed of an even number of inverters INV20 to INV23 and a NOR gate NOR1. The pulse generating circuit 5 generates, in sync with a rising of the clock signal CK1, a first timing pulse PULSE whose pulse width is determined by the delay caused by the inverters INV20 to INV23.

Further, the pulse generating circuit 5 includes a NOR gate NOR2, which receives an output from the NOR gate NOR1 of the pulse width setting circuit 52 and a signal obtained by inverting the clock signal CK1 via the inverter INV25, and produces a logical output. The output of the NOR gate NOR2 is the second timing pulse PULSEN. The pulse width of the first timing pulse PULSE is univocally determined by the even number of inverter chain INV20 to INV23. However, the pulse width of the second timing pulse PULSEN is limited by a falling of the clock signal CK1. That is, when an "H" level width of the clock signal CK1 is wide to a certain degree, the second timing pulse PULSEN has the same width as the first timing pulse PULSE, and when the clock signal CK1 is a high speed clock signal of which the "H" level width is narrow (i.e., the cycle thereof is short), the falling of the second timing pulse PULSEN is determined by the falling of the clock signal CK1.

The operations from the input of the address signal to the selection of the word line of this embodiment will be specifically described with reference to the timing chart of FIG. 3. After the external address signal Address is inputted, it is received by the address buffer 8 in accordance with a rising of the internal clock signal CK1. The internal address signal A0 outputted from the address buffer 8 is decoded by the predecoder 6 to obtain the predecoded output PD. Transfer delays are caused by the logical circuits during the period from the rising of the clock signal CK1 to the obtaining of the predecoded output PD.

The timing pulse PULSE is designed to rise slightly after the predecoded output PD is obtained, and to have a predetermined width T1. In FIG. 3, the width T1 of the timing pulse PULSE is narrower than the width (the "H" level width) T0 of the external clock signal CLK. In this case, timings and the pulse widths of the first timing pulse PULSE and the second timing pulse PULSEN are the same.

When both the first and second timing pulses PULSE and PULSEN become "H", the PMOS transistor M1 of the row decoder 7 is turned off, and the NMOS transistor M2 thereof is turned on. In the row decoder 7 in which the predecoded outputs PD are all "1's" (="H"), all of the NMOS transistors M3, M4 and M5 serving as decode gates are turned on, and the level of the node N1 of the latch circuit falls to "L". This is a "selection state", in which the level of the selected main word line MWL becomes "L". Subsequently, in a section to which a section selection signal SSL at the "L" level is inputted, the word line WL is activated to be at the "H" level.

The delay caused in a period from the input of the address signal to the selection of the word line will be considered. The rising timing of the timing pulse PULSE is determined by the logical circuits in the address buffer and the predecoder, as in the case of the prior art devices. Therefore, what should be considered is the delay caused after the rising of the timing pulse PULSE. In this embodiment, the number of the logical circuits that cause the delay in the period from the rising of the timing pulse PULSE to the activation of the selected word line is four, i.e., the switching stage (M1, M2), the latch circuit including the inverters INV11 and INV12, the inverter INV3, and the NOR gate NOR3 of the row decoder 7. This number is about a half of the number, i.e., seven, of the logical circuits in the prior art device explained with reference to FIG. 16.

Figure 16:
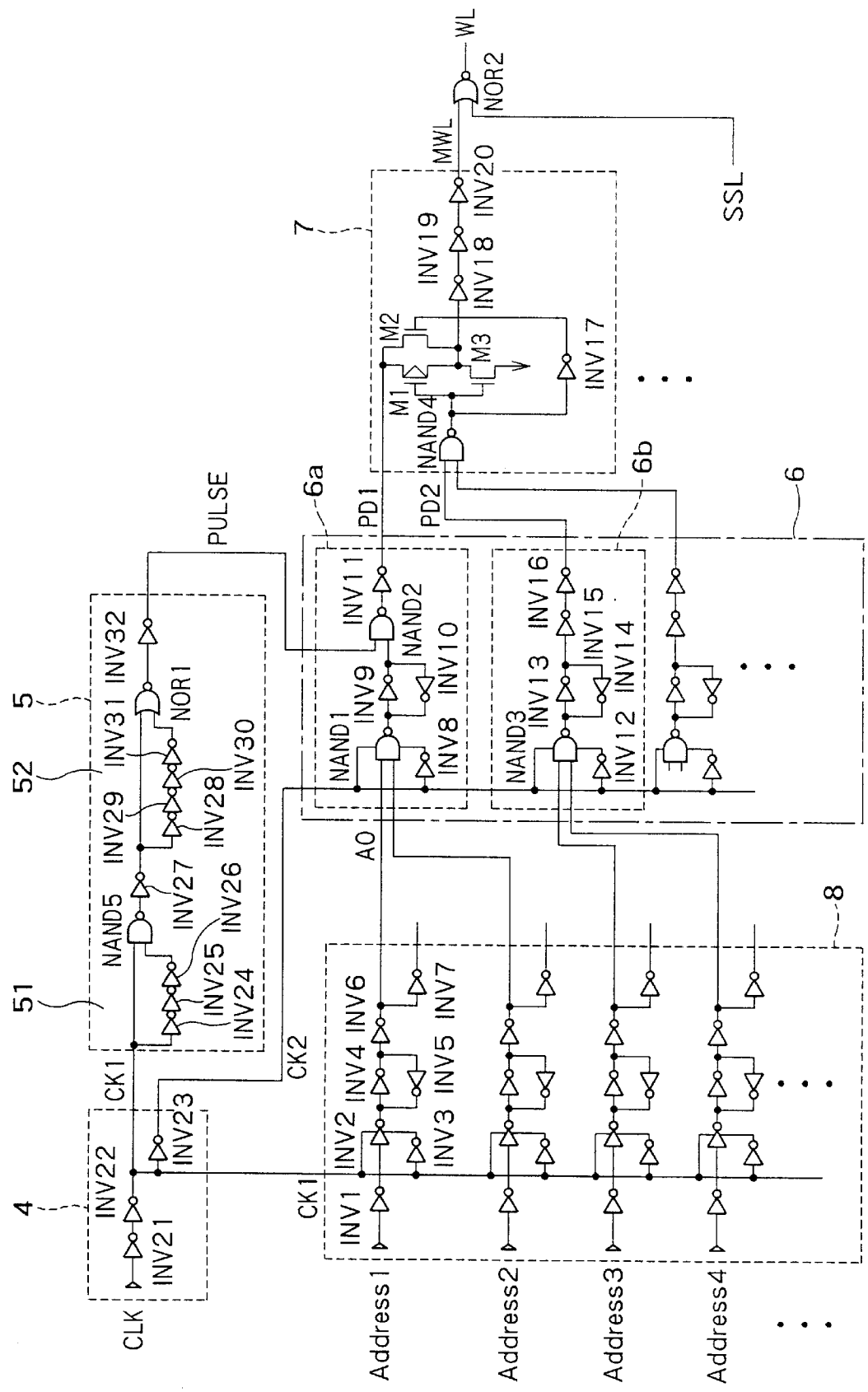
FIG. 16 is a drawing showing a configuration of a row address decoding system of the semiconductor memory circuit shown in FIG. 14.
Figure 17:
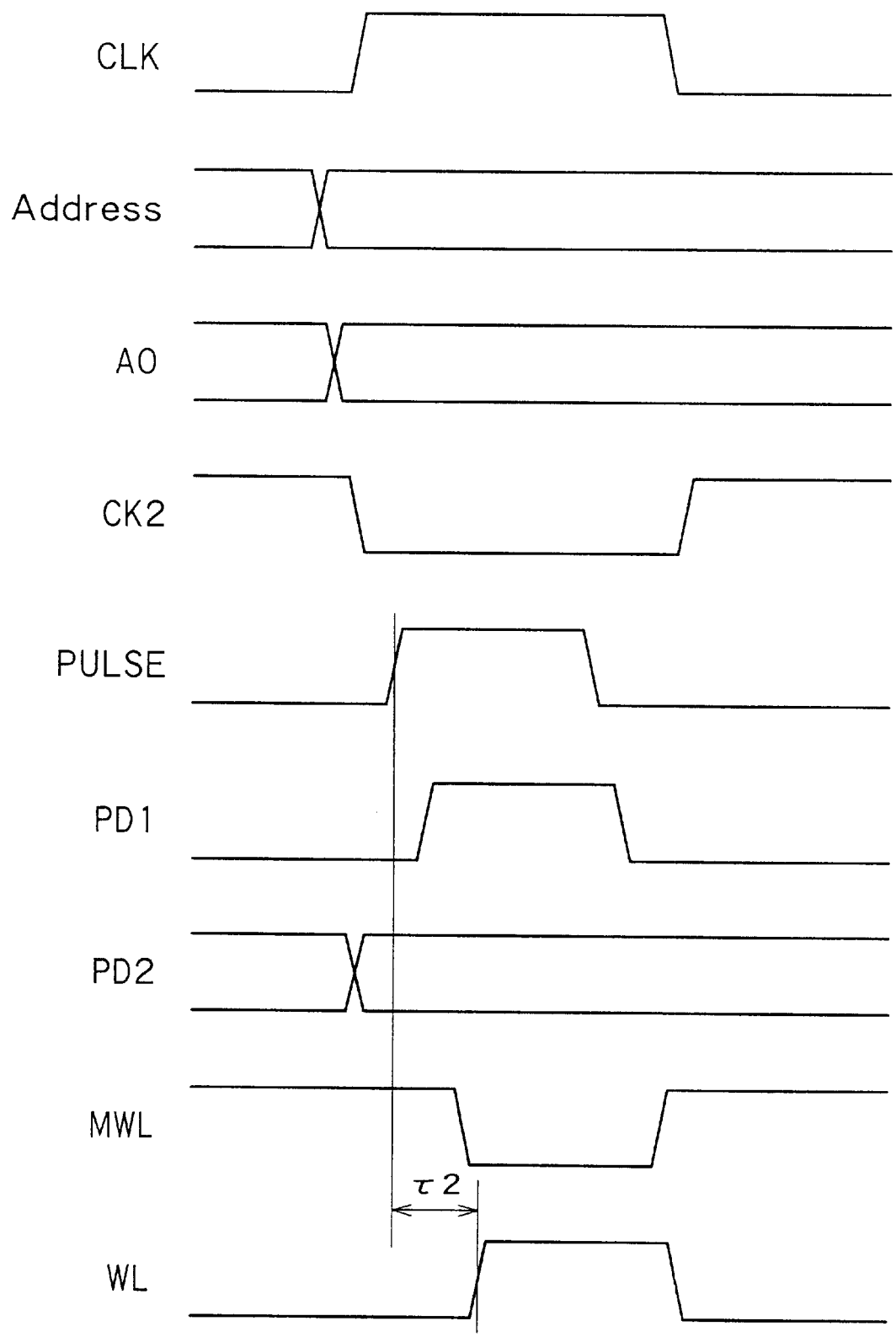
FIG. 17 is an operation timing chart for activating a word line of the semiconductor memory circuit shown in FIG. 14.

In the prior art device shown in FIG. 16, the three inverters INV18 to INV20 are provided in the row decoder 7 for the purpose of waveform formation. However, in this embodiment, no waveform formation processing is necessary since the row decoder 7 is provided with a latch circuit that can produce an ample "H" level output. Therefore, only a single inverter INV13 is inserted to the output stage of the row decoder 7. Because of this, the delay τ1 caused in a period between the rising of the timing pulse PULSE and the activation of the selected word line WL is shorter than the delay τ2 of the prior art device shown in FIG. 17. Thus, a speedup in the operations from the input of a clock signal to the activation of a word line can be achieved.

Moreover, in this embodiment, a speedup is achieved as a result of a modification of the pulse width of the second timing pulse PULSEN in accordance with a speedup of the external clock signal. This point will be specifically explained. In the prior art devices, the width of the timing pulse PULSE is not determined by the width of the external clock signal CLK, but determined by the length of the activated state of the main word line MWL, i.e., the word line WL. In this embodiment, the conditions are the same when the width of the external clock signal CLK is rather wide, e.g., T0. In this case, the length of the activated state of the main word line MWL and the word line WL is determined by the width of the timing pulses PULSE and PULSEN.

Figure 3:
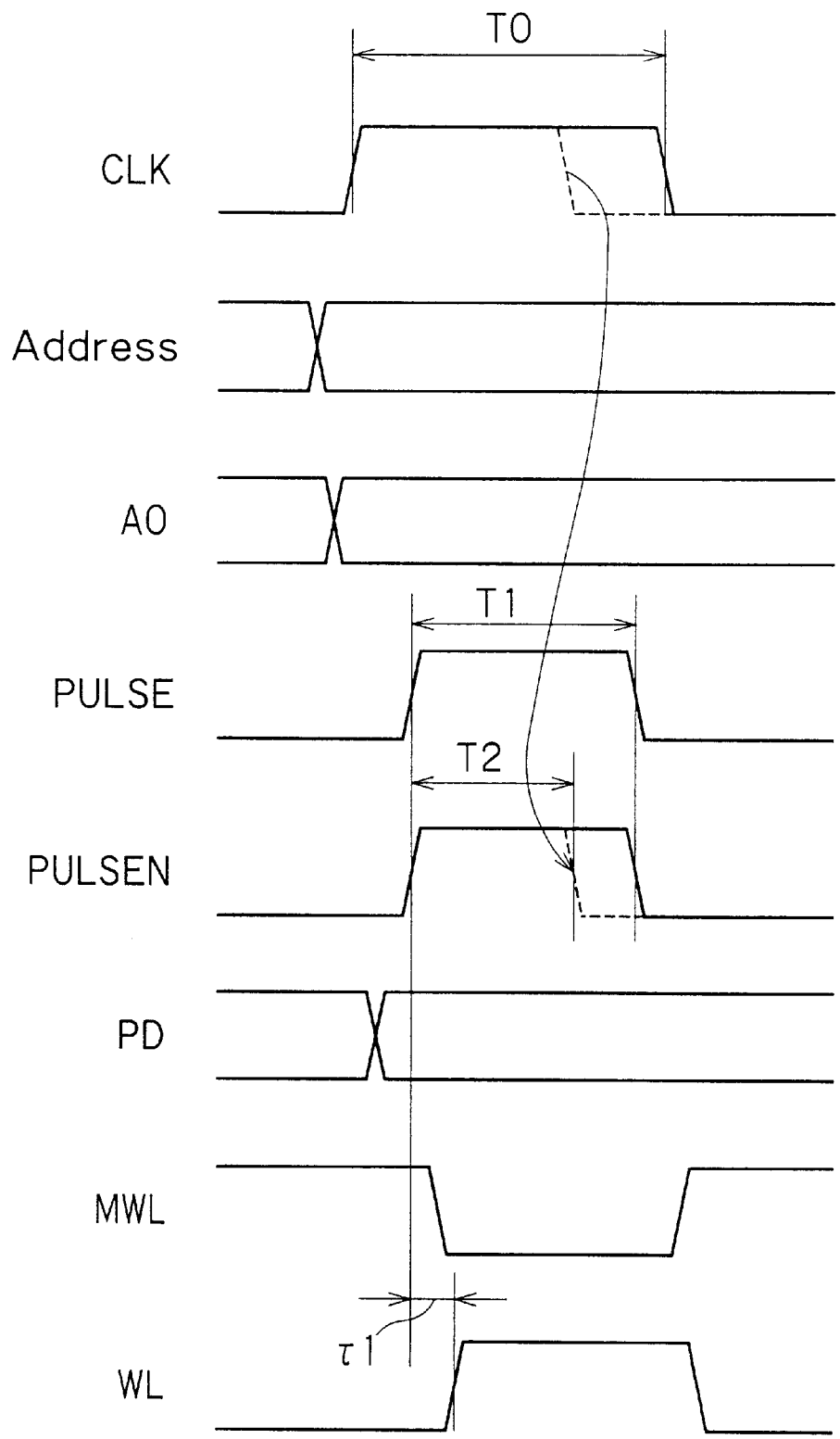
FIG. 3 is an operation timing chart of the embodiment shown in FIG. 1.

In contrast with this, it is assumed that a speedup of the external clock signal CLK is achieved and the width thereof has become narrower, as shown by a broken line in FIG. 3. In this case, in the pulse generating circuit 5, since the falling timing of the clock signal inputted to the NOR gate NOR2 is advanced, the falling of the second timing pulse PULSEN is advanced, and the pulse width thereof is narrowed, as shown as T2. As mentioned before, when the timing pulses PULSE and PULSEN are the same, in the row decoder 7, the PMOS transistor M1 is turned on and the NMOS transistor M2 is simultaneously turned off.

However, when the falling of the second timing pulse PULSEN is advanced, it is possible that the PMOS transistor M1 may be turned off by the "H" state of the first timing pulse PULSE, and the NMOS transistor M2 may be turned off by the "L" state of the second timing pulse PULSEN. This situation causes a floating state of the input node N1 of the latch circuit, i.e., an unactivated state of the row decoder 7. However, since the latch circuit holds the data inputted before this time, the main word line MWL and the word line WL is temprarily held in the activated state. After that, when the timing pulse PULSE falls and thus turns on the PMOS transistor M1, the main word line MWL and the word line WL are brought into an unactivated state. Specifically, in this embodiment, the timing pulse PULSEN is modulated in accordance with the speedup of the external clock signal CLK so that the timing for substantially making the row decoder 7 unactivated is advanced. Accordingly, high-speed access can be achieved.

In addition, a conventional row docoder uses a CMOS configuration NAND gate whereas in the present embodiment, the input gate section is only the gate of the NMOS transistor. Therefore, the load capacity of the predecoder 6 is relatively small. Accordingly, the delay caused by the load capacity is negligible, and the speedup of the operations can be achieved.

Moreover, in the conventional systems, two decoding sections are necessary for the predecoder. However, in this embodiment, the predecoder consists of only one decoding section. Further, in the conventional systems, the row decoder 7 is a combination of the transfer gate section and the NAND gate whereas in this embodiment, the row decoder consists of the decoding section formed of serial connected NMOS transistors and the switching section for activating the decoding section. Therefore, as compared to the conventional systems, in this embodiment, circuit configuration is rather simple, chip area is reducible, and circuit adjustment is easy.

Further, in the current semiconductor memory systems, a late write system, in which a writing operation is delayed for a few clock signals relative to a reading operation, is sometimes employed. In this case, if it is intended to control the switching between a read address and a write address by a predecoder housing a latch circuit, the configuration of the predecoder becomes rather complicated. In this embodiment, since the predecoder does not have any latch circuit, but only has logical circuits, the switching between a read address and a write address is rather easy.

In this embodiment, the timing pulses PULSE and PULSEN are generated based on a rising edge of the external clock signal CLK, but it is possible to use a falling edge, or both the rising and falling edges.

(Second Embodiment)

Figure 4:
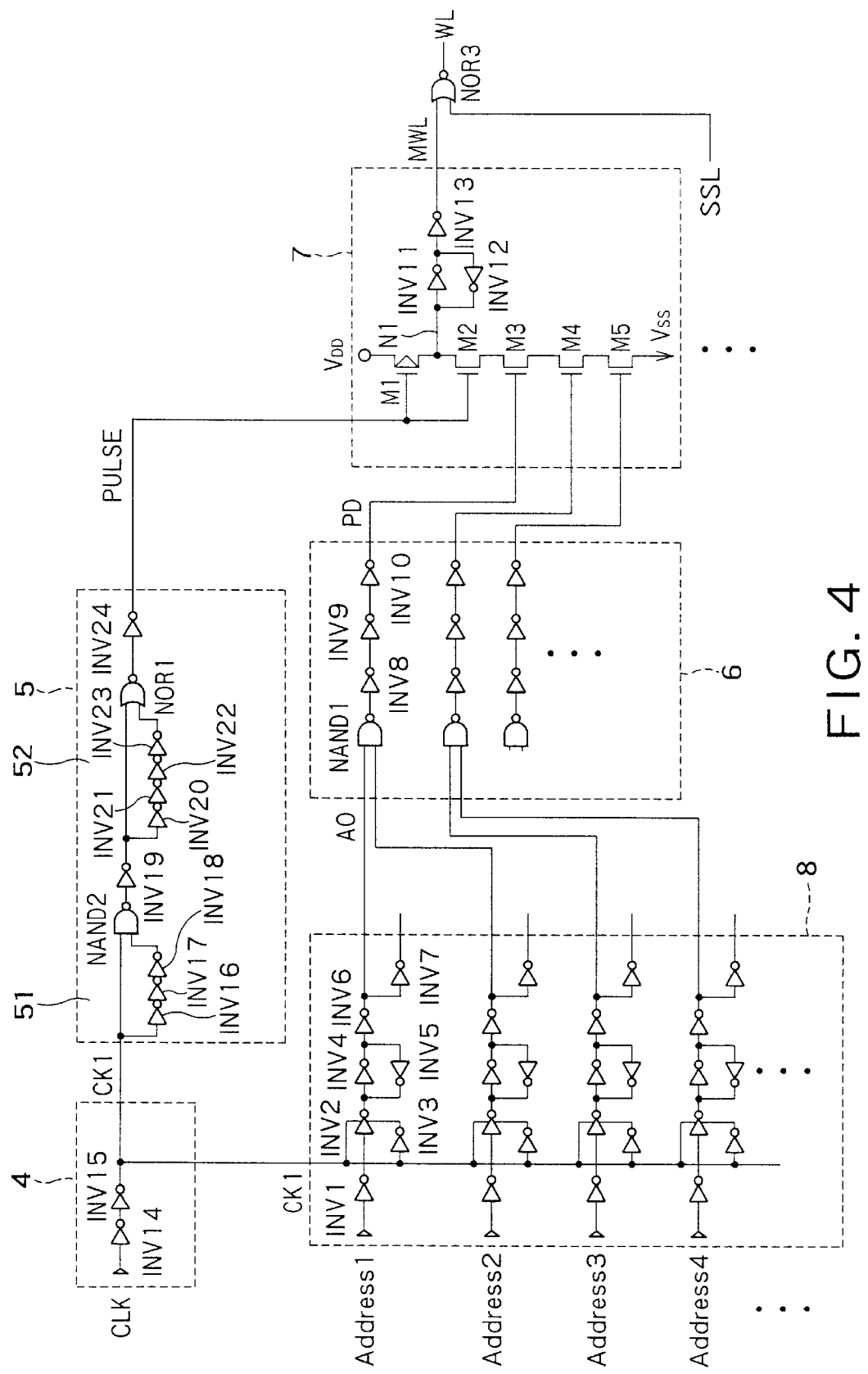
FIG. 4 is a drawing showing a specific configuration of a second embodiment according to the present invention.

FIG. 4 shows a configuration of a main part of a semiconductor memory integrated circuit according to a second embodiment of the present invention, corresponding to the main part according to the first embodiment shown in FIG. 2. The difference between FIG. 4 and FIG. 2 lies in that the pulse generating circuit 5 generates only a single kind of timing pulse PULSE, as in the case of the conventional devices. This timing pulse PULSE is commonly inputted to the PMOS transistor M1 for the activation of the row decoder 7 and the gate of the NMOS transistor M2.

The two timing pulses PULSE and PULSEN described in the explanation of the first embodiment are the same when the pulse width of the external clock signal CLK is rather wide. Therefore, if a system is intended to receive only the external clock signal CLK having a long cycle, it is possible to operate the system by only a single timing pulse PULSE, as in this embodiment. Thus, it is possible to reduce the number of signal lines, thereby simplifying the circuit configuration.

(Third Embodiment)

Figure 5:
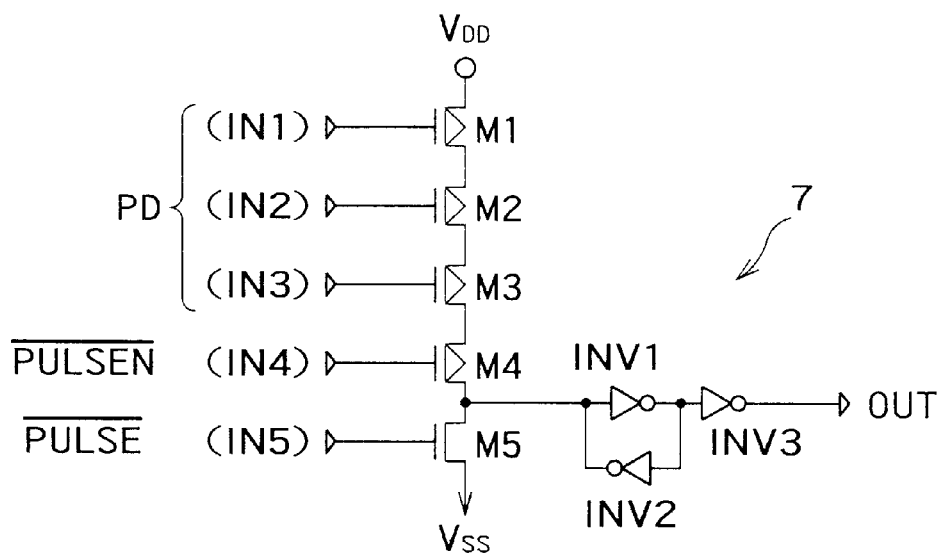
FIG. 5 is a drawing showing a configuration of a row decoder of a third embodiment according to the present invention.

FIG. 5 shows another configuration of the row decoder 7. Compared to the second embodiment, the PMOS transistors M1 to M3 correspond to the decoding gates, to which the predecoded output PD is inputted. In this case, however, when the predecoded output PD is all "0's" (="L"), a selected state is accomplished. An inverted signal /PULSEN obtained by inverting the timing pulse PULSEN is inputted to the PMOS transistor M4, and an inverted signal /PULSE obtained by inverting the timing pulse PULSE is inputted to the NMOS transistor M5, thereby generating functions substantially similar to those of the row decoder of the above described embodiments. However, in the circuit configuration shown in FIG. 4, in which only a single timing pulse PULSE is used, /PULSEN becomes /PULSE.

(Fourth Embodiment)

Figure 6:
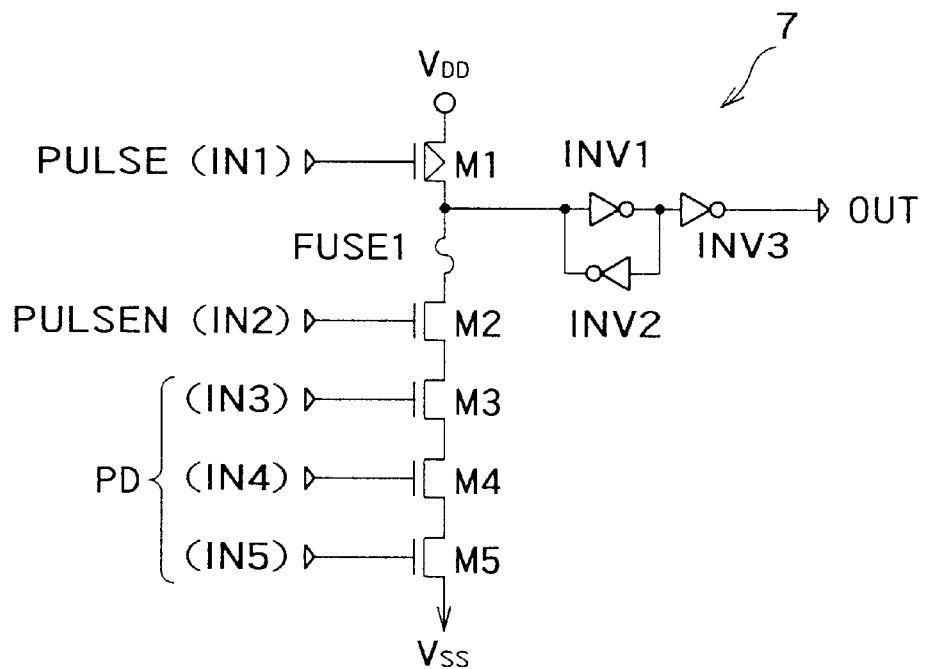
FIG. 6 is a drawing showing a configuration of a row decoder of a fourth embodiment according to the present invention.

FIG. 6 shows still another configuration of the row decoder 7. This is basically the same as the row decoder 7 of the first embodiment, but the difference lies in that a fuse Fuse1 is inserted between the PMOS transistor M1 and the NMOS transistor M2. Normally, semiconductor memory circuits employ a redundant circuit system, in which the row decoder corresponding to a defective row should be replaced and therefore be held in an unactivated state. By cutting the fuse Fuse1, it is possible to continuourly hold the row decoder 7 in an unactivated state.

(Fifth Embodiment)

Figure 7:
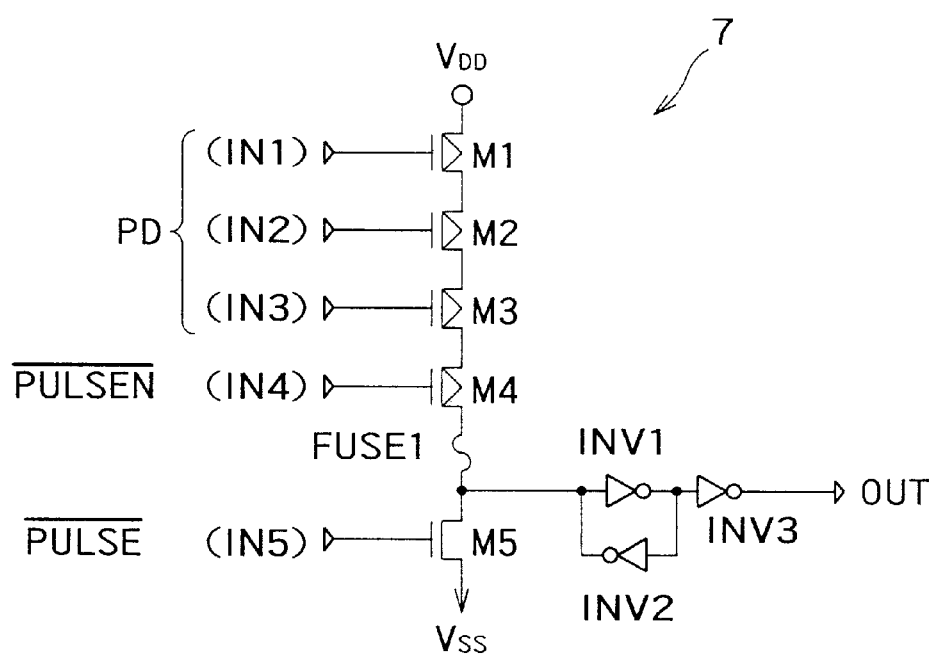
FIG. 7 is a drawing showing a configuration of a row decoder of a fifth embodiment according to the present invention.

FIG. 7 shows a further configuration of the row decoder 7. This row decoder is established by inserting a fuse Fuse1 between the transistors M1 and M5, for the purpose of employing a redundant circuit system, in the row decoder 7 shown in FIG. 5. Also in this case, the row decoder 7 is always held in an unactivated state by cutting the fuse Fuse1.

(Sixth Embodiment)

Figure 8:
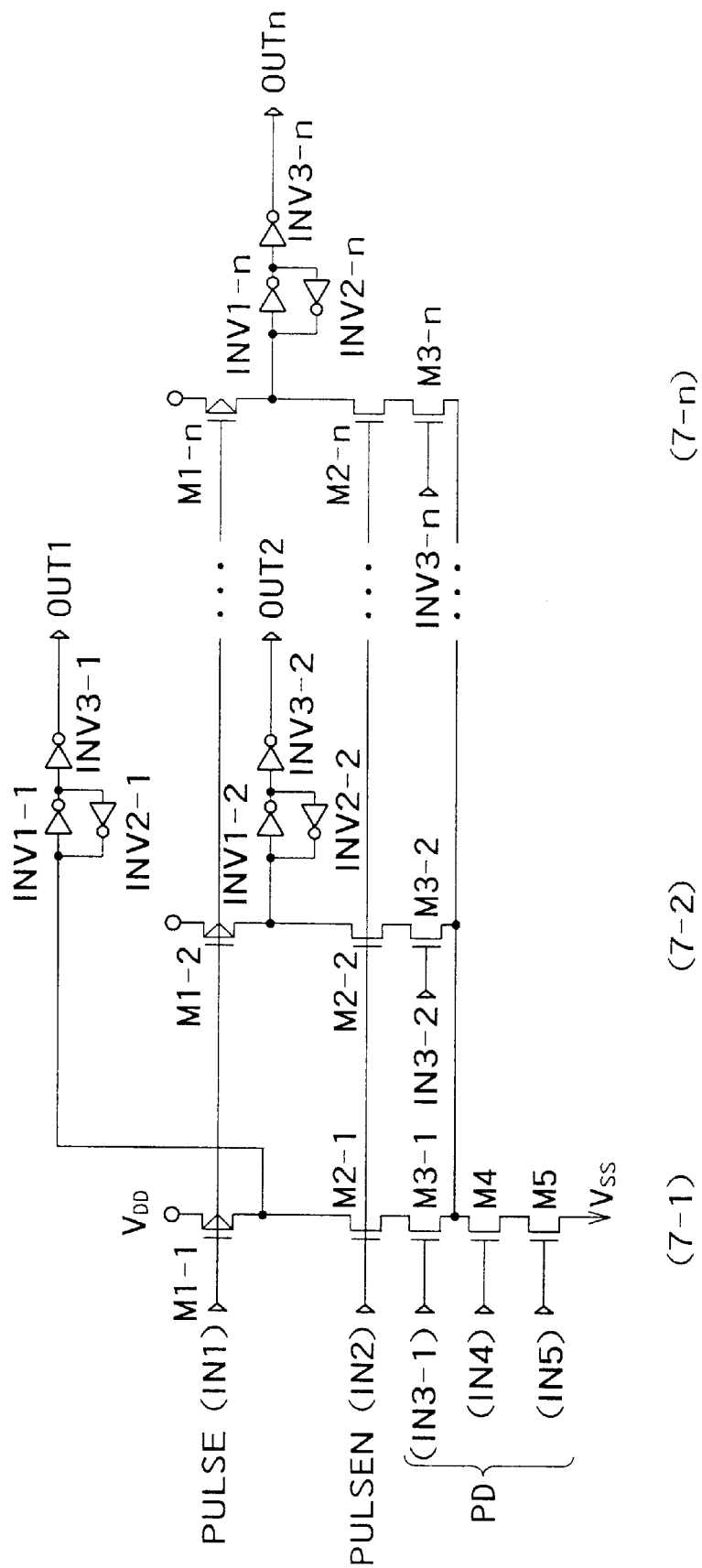
FIG. 8 is a drawing showing a configuration of a row decoder of a sixth embodiment according to the present invention.

FIGS. 2 and 4 each show only a single row decoder 7. However, actually, a plurality of row decoders are used so as to correspond to a plurality of main word lines MWL. FIG. 8 shows a preferable relationship between plural row decoders 7-1, 7-2 . . . 7-n. The basic configuration of each row decoder is the same as that shown in FIG. 2 or FIG. 4. The first timing pulse PULSE is commonly inputted to the PMOS transistors M1-1, M1-2 . . . of the row decoders 7-1, 7-2, . . . 7-n, and the second timing pulse PULSEN is commonly inputted to the NMOS transistors M2-1, M2-2, . . . of the row decoders 7-1, 7-2, . . . , 7-n.

One predecoded output PD is commonly inputted to the gates of the NMOS transistors M3-1, M3-2, . . . , M3-n, and the other two predecoded outputs PD are inputted to the NMOS transistors M4 and M5, which are shared by the plural row decoders 7-1, 7-2, . . . , 7-n. The reason for sharing the decoding transistors of the row decoders is as follows. For example, eight row decoders for decoding three bits, a0, a1 and a2 are considered. A row decoder for which the effecting condition is a0, a1, a2=0, 0, 0 (i.e., the actual input is all "1's") and a row decoder for which the effecting condition is a0, a1, a2=1, 0, 0 can share the gates of the upper two bits a1 and a2.

Thus, by partially sharing the row decoders, it is possible to reduce the circuit size.

(Seventh Embodiment)

Figure 9:
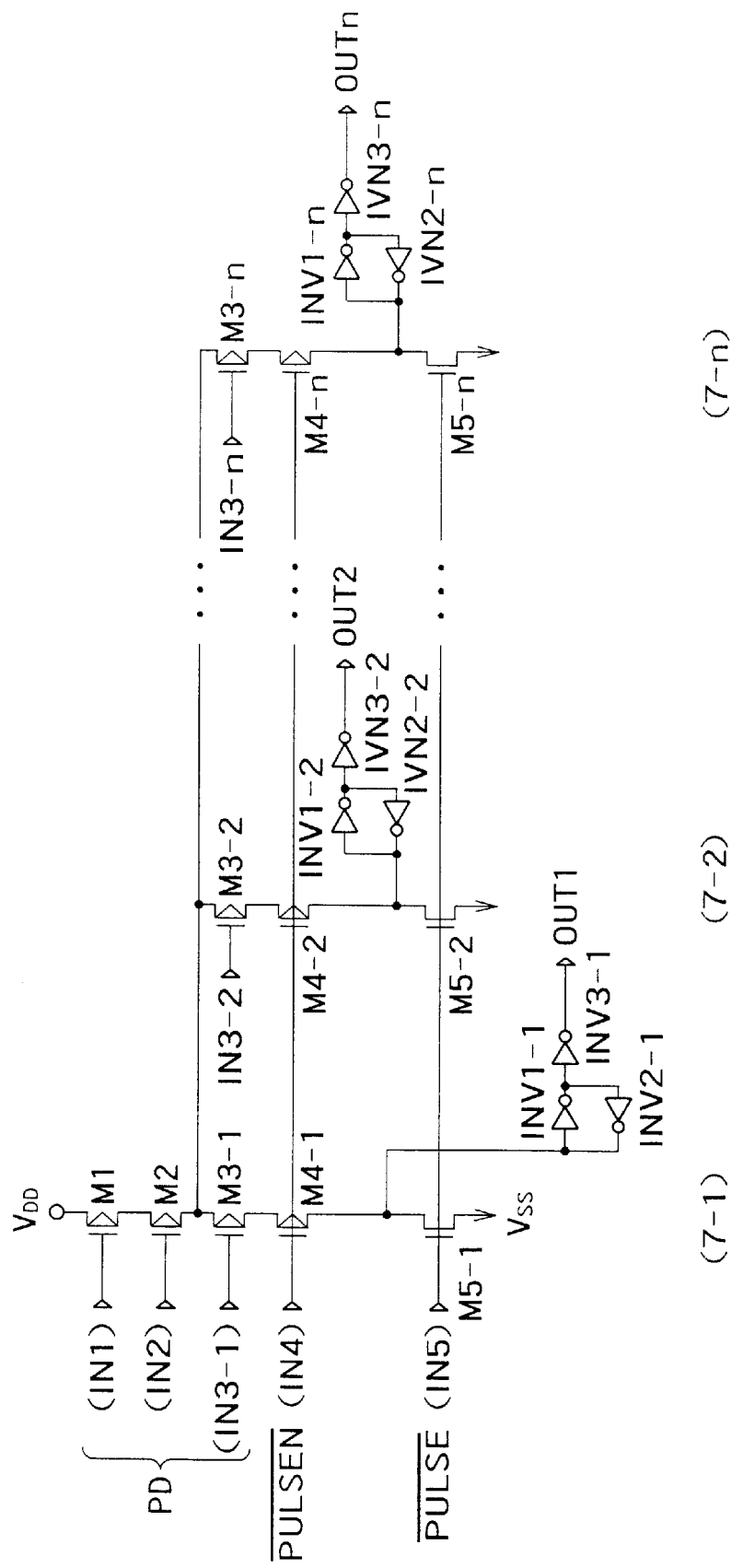
FIG. 9 is a drawing showing a configuration of a row decoder of a seventh embodiment according to the present invention.

FIG. 9 shows that in the row decoder configuration shown in FIG. 5, the decoding transistors M1 and M2 are shared by a plurality of row decoders 7-1, 7-2, ..., 7-n for the purpose similar to that in the case of FIG. 8. In this way, it is possible to reduce the circuit size.

(Eighth Embodiment)

Figure 10:
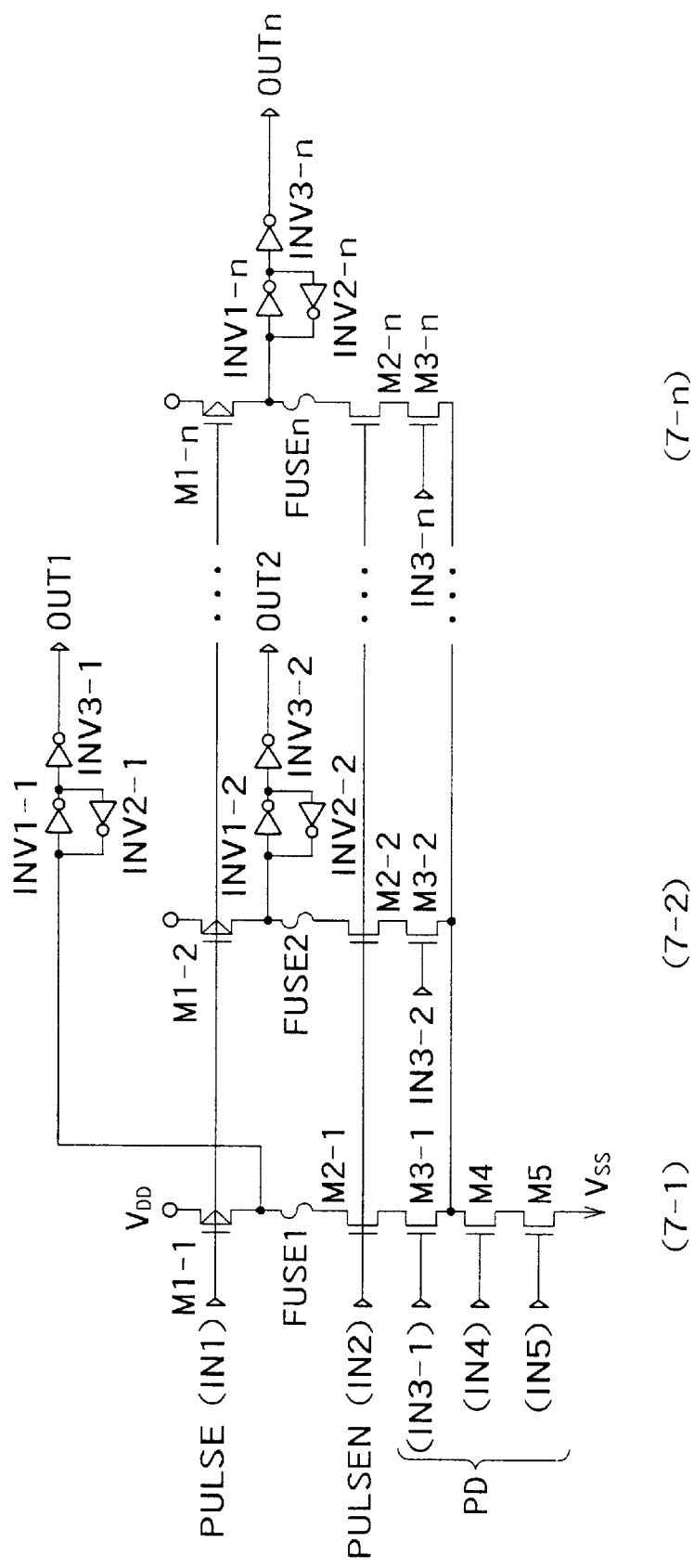
FIG. 10 is a drawing showing a configuration of a row decoder of an eighth embodiment according to the present invention.

Similarly, FIG. 10 shows that in the row decoder configuration shown in FIG. 6, the decoding transistors M4 and M5 are shared by a plurality of row decoders 7-1, 7-2, ..., 7-n. In this way, it is possible to reduce the circuit size.

(Ninth Embodiment)

Figure 11:
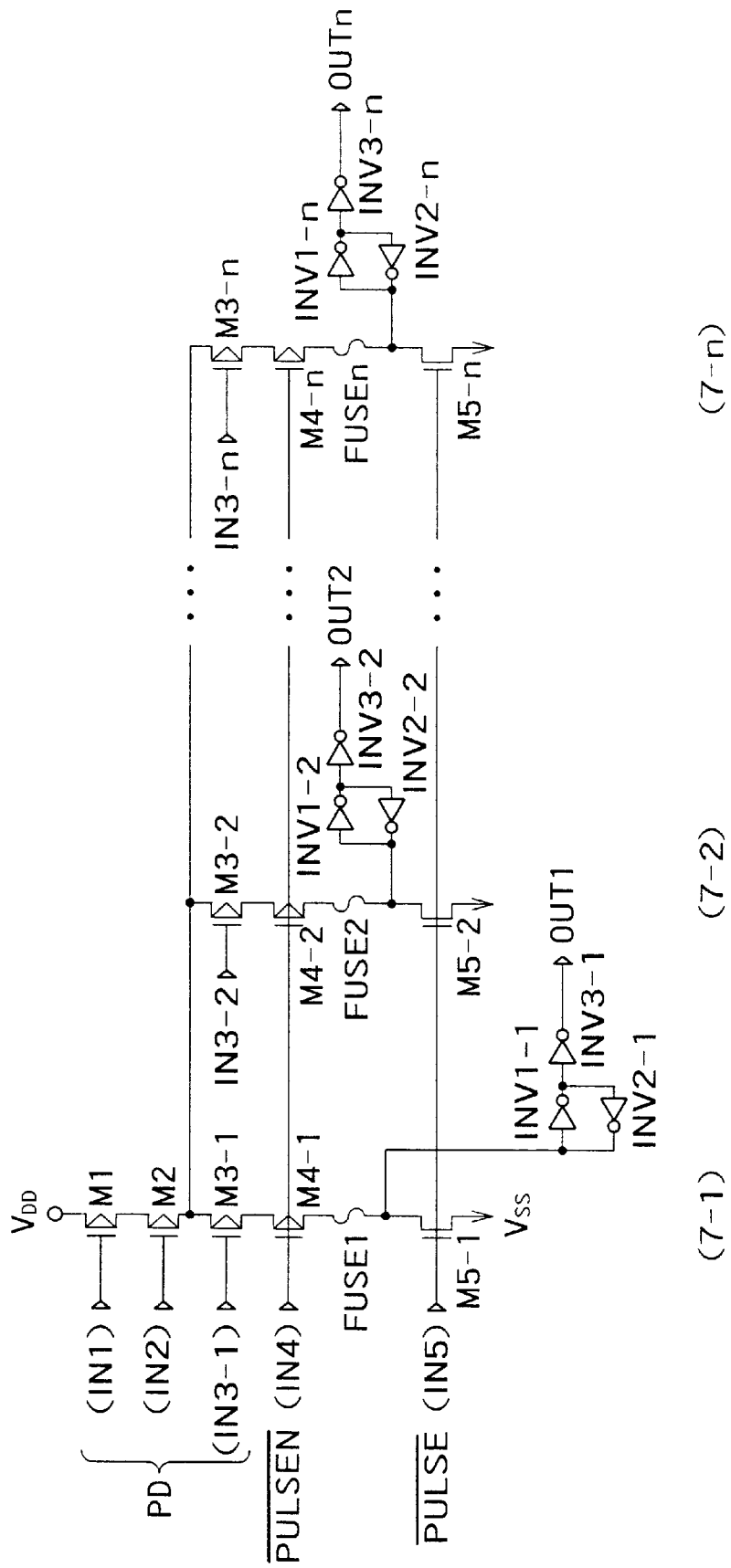
FIG. 11 is a drawing showing a configuration of a row decoder of a ninth embodiment according to the present invention.

Similarly, FIG. 11 shows that in the row decoder configuration of FIG. 7, the decoding transistors M1 and M2 are shared by a plurality of row decoders 7-1, 7-2, ..., 7-n. In this way, it is possible to reduce the circuit size.

(Tenth Embodiment)

As mentioned in the explanations of the above embodiments, the gate section to which the predecoded outputs of the row decoder 7 are inputted includes only directly connected NMOS transistors. In this case, in order to surely operate the data latch circuit provided in the row decoder 7, several conditions must be met. Such conditions will be specifically described using the row decoder of FIG. 6 as an example.

Figure 12:
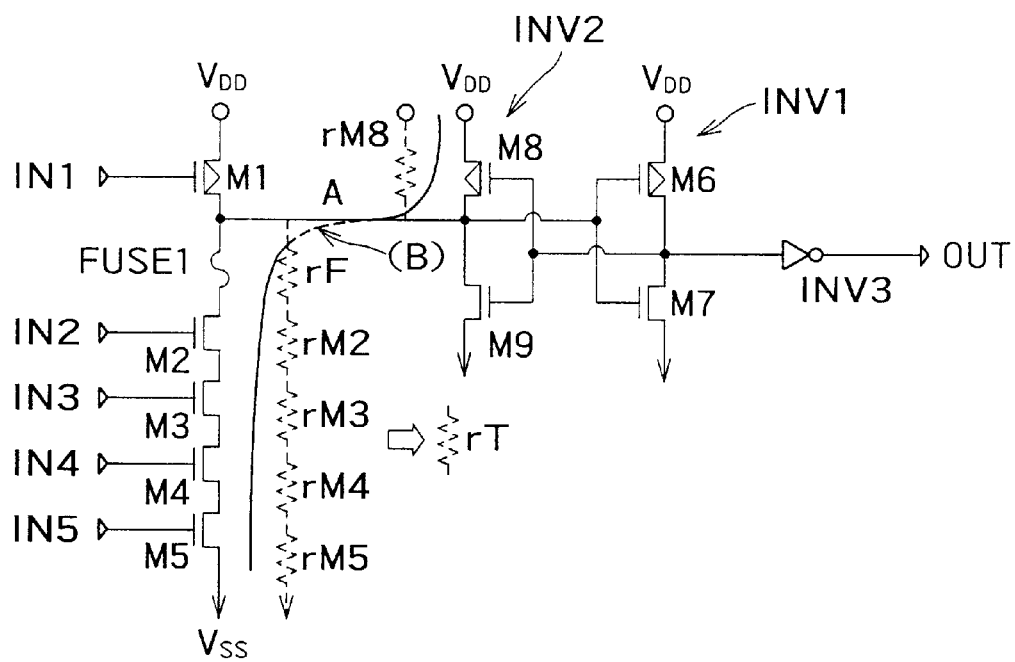
FIG. 12 is an equivalent circuit diagram for explaining conditions necessary for a row decoder according to the present invention.

FIG. 12 specifically shows the latch circuit section of the row decoder 7 of FIG. 6 including the inverters INV1 and INV2. In this row decoder 7, when it is not selected, the PMOS transistor M1 is in an "ON" state, the NMOS transistor M2 is in an "OFF" state, and the node A is in a "H" state. When the timing pulses PULSE="H" and PULSEN= "H" are inputted, the row decoder is held in an selected state, in which the PMOS transistor M1 is "OFF", the NMOS transistor M2 is "ON", and the predecoded outputs PD are all "H", thereby turning on the NMOS transistors M2 to M5 to reduce the electric potential at the node A. At this time, as shown by the broken line B in FIG. 12, a current flows through the fuse Fuse1 and the NMOS transistors M2 to M5 via the PMOS transistor M8 of the inverter INV2.

At this time, in order to turn off the inverter INV1 formed of the PMOS transistor M6 and the NMOS transistor M7, it is necessary to reduce the electric potential of the node A below the circuit threshold value of the inverter INV1. If the gate threshold values of the NMOS transistor M7 and the PMOS transistor M6 are substantially the same, the circuit threshold value of the inverter INV1 is around VDD/2.

Figure 13:
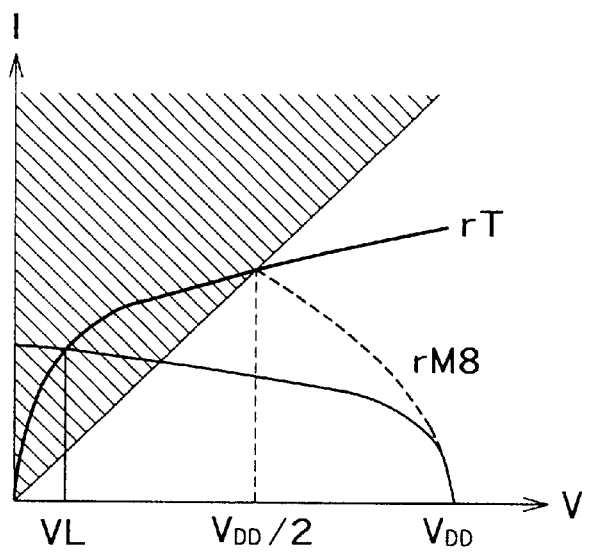
FIG. 13 is a characteristics chart for explaining conditions necessary for a row decoder according to the present invention.
Figure 14:
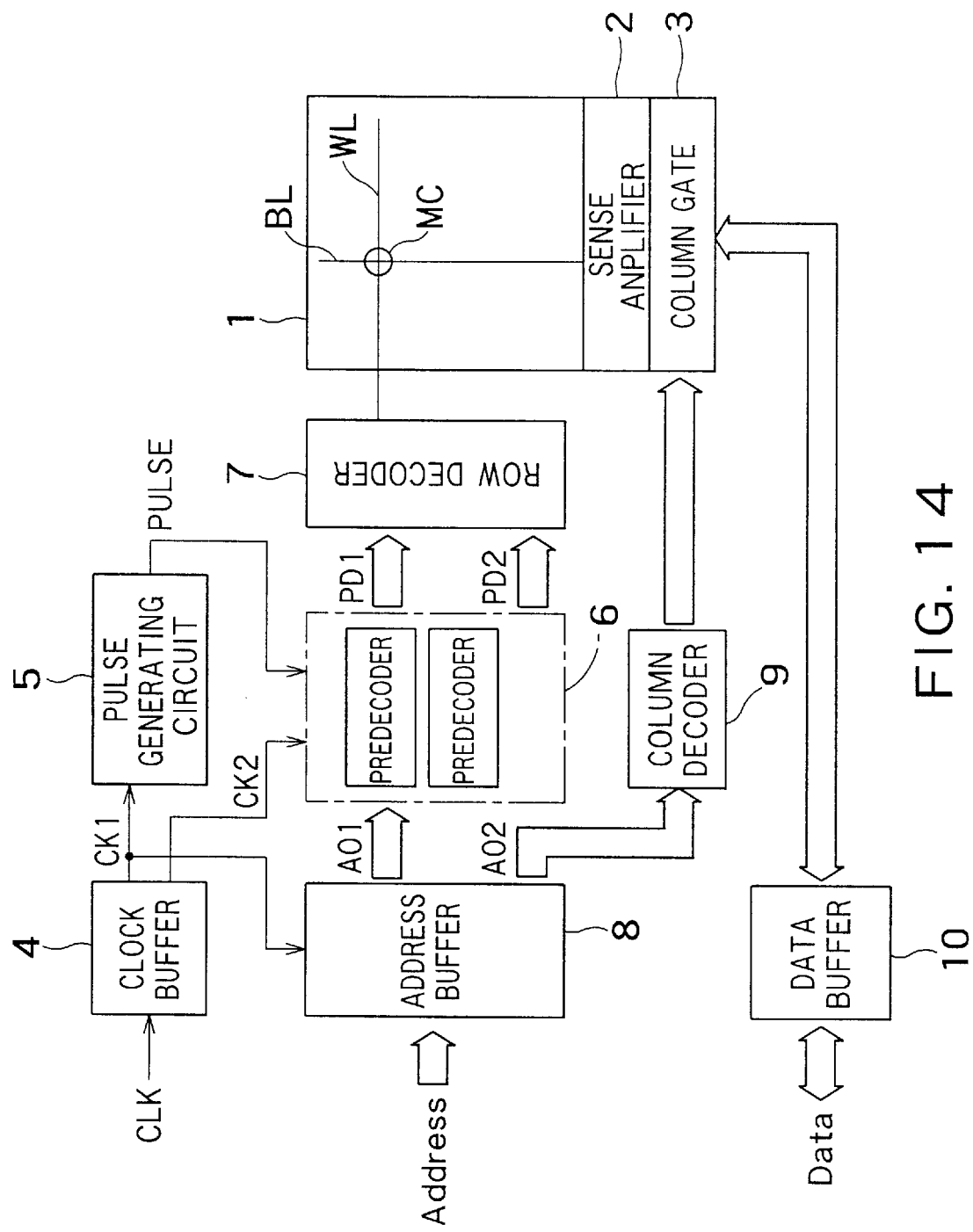
FIG. 14 is a block diagram showing a conventional semiconductor memory circuit.

As shown in FIG. 12, the equivalent resistance obtained by adding the equivalent resistances of the fuse Fuse1 and the NMOS transistors M2 to M5 is denoted by rT, and the load resistance of the PMOS transistor M8 of the inverter INV2 is denoted by rM8. Then, as shown in FIG. 13, the intersection voltage VL at the intersecting point of the equivalent static characteristics curve rT of the entire part of the NMOS transistors M2 to M5 and the load curve rM8 is the lower level voltage of the node A. Accordingly, in order to invert the latch circuit in a row-decoder-selected state, it is necessary that the intersection voltage VL be below the circuit threshold value of the inverter INV1.

It is necessary to design the sizes of the NMOS transistors M2 to M5, the fuse Fuse1 and the PMOS transistor M8 of the inverter INV2 so as to meet the above described requirement. If the resistance of the PMOS transistor M8 is relatively large, and therefore the load curve rM8 becomes the one shown by the broken line in FIG. 13, the low-level stability point is not below VDD/2. Accordingly, it is not possible to invert the latch circuit. Thus, it is necessary to design a circuit so that the low-level stability point is within the range represented by the shaded portion in FIG. 13.

A similar relationship should be established between the PMOS transistor M1 and the NMOS transistor M9 of the inverter INV2 so as to invert the inverter INV2. Further, similar conditions should be met for the row decoders shown in FIGS. 5 and 7.

As described previously, according to the present invention, it is possible to obtain a semiconductor memory integrated circuit which has fewer logical circuits needed to be used from the input of a clock signal to the activation of a word line so as to speed up operations.

What is claimed is:

1. A semiconductor memory integrated circuit comprising:

a memory cell array;

a clock buffer for receiving a clock signal to generate an internal clock signal;

an address buffer for receiving an address signal in accordance with said internal clock signal generated by said clock buffer;

an address decoding circuit including a first stage decoder for decoding an internal address signal outputted from said address buffer to select a word line of said memory cell array, and a second stage decoder for further decoding an output of said first decoder to drive a selected word line; and a pulse generating circuit for generating a timing pulse for controlling an activation timing of said second decoder of said address decoding circuit based on the internal clock signal outputted from said clock buffer;

wherein said address buffer includes a first latch circuit for temporally holding the received address signal, and said second stage decoder of said address decoding circuit includes a second latch circuit for temporally holding a decoded output transferred from said first stage decoder.

2. The semiconductor memory integrated circuit according to claim 1, wherein said first stage decoder provided between said address buffer including said first latch circuit and said second stage decoder including said second latch circuit includes no latch circuit.

3. The semiconductor memory integrated circuit according to claim 1, wherein said second stage decoder includes:

a row of a plurality of series connected decoding transistors to gates of which plural decoded outputs transferred from said first stage decoder are inputted; and a switching transistor provided between said row of decoding transistors and an input node of said second latch circuit, and activated by said timing pulse.

4. The semiconductor memory integrated circuit according to claim 3 including more than one second stage decoders, wherein some of transistors in said row of decoding transistors of one second stage decoder are shared by other second stage decoder.

5. The semiconductor memory integrated circuit according to claim 3 including more than one second stage decoders, wherein said switching transistor of one second stage decoder is shared by other second stage decoder.

6. A semiconductor memory integrated circuit comprising:

a memory cell array;

a clock buffer for receiving a clock signal to generate an internal clock signal;

an address buffer for receiving an address signal in accordance with said internal clock signal generated by said clock buffer;

an address decoding circuit including a first stage decoder for decoding an internal address signal outputted from said address buffer to select a word line of said memory cell array, and a second stage decoder for further decoding an output of said first decoder to drive a selected word line; and a pulse generating circuit for generating a timing pulse for controlling an activation timing of said second decoder of said address decoding circuit based on the internal clock signal outputted from said clock buffer;

wherein said pulse generating circuit generates a first timing pulse having a predetermined pulse width and a second timing pulse whose pulse width varies in accordance with a cycle of the clock signal.

7. The semiconductor memory integrated circuit according to claim 6, wherein said second stage decoder includes:

a row of a plurality of series connected decoding transistors, of which one end is connected to a first power supply terminal, a plurality of decoded outputs being transferred from said first stage decoder to the gates of said series connected transistors;

a first switching transistor provided between the other end of said row of decoding transistors and an input node of said second latch circuit, and activated by said second timing pulse; and a second switching transistor provided between said input node of said second latch circuit and a second power supply terminal, and turned on/off so as to be complementary to said first switching transistor in accordance with said first timing pulse.

8. The semiconductor memory integrated circuit according to claim 7, wherein said row of decoding transistor is a row of NMOS transistors, said first switching transistor is an NMOS transistor, and said second switching transistor is a PMOS transistor.

9. The semiconductor memory integrated circuit according to claim 8, wherein a fuse is provided between said first switching transistor and said input node of said second latch circuit for replacing a defective address.

10. The semiconductor memory integrated circuit according to claim 7, wherein said row of decoding transistor is a row of PMOS transistors, said first switching transistor is a PMOS transistor, and said second switching transistor is an NMOS transistor.

11. The semiconductor memory integrated circuit according to claim 10, wherein a fuse is provided between said first switching transistor and said input node of said second latch circuit for replacing a defective address.

12. The semiconductor memory integrated circuit according to claim 7, wherein a fuse is provided between said first switching transistor and said input node of said second latch circuit for replacing a defective address.

13. A semiconductor memory integrated circuit comprising:

a memory cell array;

a clock buffer for receiving a clock signal to generate an internal clock signal;

an address buffer for receiving an address signal in accordance with said internal clock signal generated by said clock buffer;

an address decoding circuit including a first stage decoder for decoding an internal address signal outputted from said address buffer to select a word line of said memory cell array, and a second stage decoder for further decoding an output of said first decoder to drive a selected word line; and a pulse generating circuit for generating a timing pulse for controlling an activation timing of said second stage decoder of said address decoding circuit based on the internal clock signal outputted from said clock buffer;

wherein said pulse generating circuit generates a timing pulse having a predetermined pulse width; and, wherein said second stage decoder includes:

a row of a plurality of series connected decoding transistors, of which one end is connected to a first power supply terminal, a plurality of decoded outputs being transferred from said first stage decoder to the gates of said series connected transistors;

a first switching transistor provided between the other end of said row of decoding transistors and an input node of said second latch circuit, and activated by said second timing pulse; and a second switching transistor provided between said input node of said second latch circuit and a second power supply terminal, and turned on/off so as to be complementary to said first switching transistor in accordance with said first timing pulse.

14. The semiconductor memory integrated circuit according to claim 13, wherein said row of decoding transistor is a row of NMOS transistors, said first switching transistor is an NMOS transistor, and said second switching transistor is a PMOS transistor.

15. The semiconductor memory integrated circuit according to claim 14, wherein a fuse is provided between said first switching transistor and said input node of said second latch circuit for replacing a defective address.

16. The semiconductor memory integrated circuit according to claim 13, wherein said row of decoding transistor is a row of PMOS transistors, said first switching transistor is a PMOS transistor, and said second switching transistor is an NMOS transistor.

17. The semiconductor memory integrated circuit according to claim 16, wherein a fuse is provided between said first switching transistor and said input node of said second latch circuit for replacing a defective address.

18. The semiconductor memory integrated circuit according to claim 13, wherein a fuse is provided between said first switching transistor and said input node of said second latch circuit for replacing a defective address.

* * * * *